United States Patent
Kasa et al.

(10) Patent No.: US 6,662,262 B1
(45) Date of Patent: Dec. 9, 2003

(54) OTP SECTOR DOUBLE PROTECTION FOR A SIMULTANEOUS OPERATION FLASH MEMORY

(75) Inventors: Yasushi Kasa, Kawasaki (JP); Johnny Chung-Lee Chen, Cupertino, CA (US); Guowei Wang, San Jose, CA (US); Tiao-Hua Kuo, San Jose, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/420,535

(22) Filed: Oct. 19, 1999

Related U.S. Application Data

(63) Continuation-in-part of application No. 09/421,105, filed on Oct. 19, 1999, now Pat. No. 6,125,055.

(51) Int. Cl.$^7$ .............................................. G06F 12/00
(52) U.S. Cl. ................ 711/103; 711/108; 365/185.33; 365/49
(58) Field of Search ................................ 711/103, 108; 365/49, 50, 185.33

(56) References Cited

U.S. PATENT DOCUMENTS

| | | | |
|---|---|---|---|
| 5,031,142 A | * | 7/1991 | Castro ........................ 365/49 |
| 5,136,544 A | * | 8/1992 | Rozman et al. ......... 365/185.04 |
| 6,275,894 B1 | * | 8/2001 | Kuo et al. .................... 711/103 |
| 2002/0129198 A1 | * | 9/2002 | Nataraj et al. .............. 711/108 |

OTHER PUBLICATIONS

AMD, Technology Background brochure, "3.0 Volt–only Page Mode Flash Memory Technology," 22249A 10/98.
AMD, Technology Background brochure, "3.0 Volt–only Burst Mode Flash Memory Technology." 22250A 10/98.
AMD, Technology Background brochure, "1.8 Volt–only Flash Memory Technology." 21628 A 12/97.
AMD, Technology Background brochure, "AMD DL 160 and DL320 Series Flash: New Densities, New Features." 22271 A.
Intel Corporation, "Common Flash Memory Interface Specification," Release 1.1, May 30, 1997.
AMD, "Common Flash Memory Interface Publication 100—Vendor & Device ID Code Assignments," Jul. 25, 1996, vol. No. 96.1.
AMD "AM29DL 162C/AM29DL 163C 16 Megabit (2 M×8–Bit/1 M×16–Bit) CMOS 3.0 Volt–only, Simultaneous Operation Flash Memory," Publication 21533, Rev: C Amendment/+2, Jun. 15, 1999.
Intel Corporation, "1.8 Volt Intel® Dual–Plane Flash Memory 28F320D18 (x16)," Product Preview Datasheet, Order No.: 290672–002, Oct. 1999.
Macronix International Co., Ltd. "MXIC Advance Information MX29VW160T/B—16M–BIT [2M×8–BIT/1M×16–BIT] Simultaneous Read/Write Single 2.5V Operation Flash Memory," P/N:PM0567, Rev. 9.8, May 17, 1999.
ATMEL Corporation, "ATMEL® 16–megabit (2M×16/2M×8) 3–volt Only Flash Memory," Rev. 0925H–08/99.

(List continued on next page.)

*Primary Examiner*—Matthew Kim
*Assistant Examiner*—Matthew D. Anderson

(57) ABSTRACT

A simultaneous operation flash memory capable of providing double protection to An OTP sector. The preferred simultaneous operation flash memory comprises an OTP write-protect CAM, which is in a programmed state if the OTP sector is write-protected. In addition, the preferred simultaneous flash memory further includes an OTP sector lock CAM that is electrically connected with the OTP write-protect CAM. The OTP sector lock CAM is used to lock the OTP write-protect CAM in the programmed state, which, in turn, will designate the OTP sector as read only.

25 Claims, 4 Drawing Sheets

OTHER PUBLICATIONS

STMicroelectronics, "M59DR032A, M59DR032B, 32 Mbit (2Mb × 16, Dual Bank, Page) Low Voltage Flash Memory," preliminary data, Oct. 1999, pp. 1–38.

"AMD—Flash Introduction," obtained at the internet address http://www.amd.com/products/n vd/overview/ flash_intro.html, Apr. 14, 1999.

"AMD—Simultaneous Read/Write," obtained at the internet address http://www.amd.com/products/nvd/overview/ simuintro.html, Jul. 12, 1999.

"AMD News Release #9879," obtained at the internet address http://www.amd.com/news/prodpr/9879.html, Oct. 19, 1998.

"Intel® 1.8 Volt Dual–Plane 32–Mbit Flash Memory (D18)," obtained at the internet address http://www.intel-.com/design/flcomp/prodbref/298131.htm, Nov. 18, 1999.

U.S. patent application, Ser. No. 09/159,029, filed Sep. 23, 1998.

U.S. patent application, Ser. No. 09/159,142, filed Sep. 23, 1998.

U.S. patent application, Ser. No. 09/159,489, filed Sep. 23, 1998.

"Intel Announces 1,8–Volt Dual–Plane Flash Memory" obtained at internet address http://www.intel.com/pressroom/archive/releases/F1092099.htm Nov. 12, 1999.

* cited by examiner

| Z4 | A20 | A19 | A18 | A17 | A16 | A15 |
|---|---|---|---|---|---|---|
| Z40 | 0 | 0 | 0 | 0 | X | X |
| Z41 | 0 | 0 | 0 | 1 | X | X |
| Z42 | 0 | 0 | 1 | 0 | X | X |
| Z43 | 0 | 0 | 1 | 1 | X | X |
| Z44 | 0 | 1 | 0 | 0 | X | X |
| Z45 | 0 | 1 | 0 | 1 | X | X |
| Z46 | 0 | 1 | 1 | 0 | X | X |
| Z47 | 0 | 1 | 1 | 1 | X | X |
| Z48 | 1 | 0 | 0 | 0 | X | X |
| Z49 | 1 | 0 | 0 | 1 | X | X |
| Z410 | 1 | 0 | 1 | 0 | X | X |
| Z411 | 1 | 0 | 1 | 1 | X | X |
| Z412 | 1 | 1 | 0 | 0 | X | X |
| Z413 | 1 | 1 | 0 | 1 | X | X |
| Z414 | 1 | 1 | 1 | 0 | X | X |
| Z415 | 1 | 1 | 1 | 1 | 0 | 0 |

X = DON'T CARE
0 = NON-CONDUCTING
1 = CONDUCTING

Fig. 2

| Z3 | A16 | A15 |
|---|---|---|
| Z3(0) | 0 | 0 |
| Z3(1) | 0 | 1 |
| Z3(2) | 1 | 0 |
| Z3(3) | 1 | 1 |

Fig. 3

OTP SECTOR DOUBLE PROTECTION FOR A SIMULTANEOUS OPERATION FLASH MEMORY

RELATED APPLICATIONS

This application is a continuation-in-part of application Ser. No. 09/421,105, filed Oct. 19,1999, entitled SECTOR WRITE PROTECT CAMS FOR A SIMULTANEOUS OPERATION FLASH MEMORY, which issued as U.S. Pat. No. 6,125,055, on Sep. 26, 2000, which is herein incorporated by reference.

FIELD OF THE INVENTION

The present invention relates generally to non-volatile memory devices and, more particularly, to a method and system for providing dual protection for a one-time programmable ("OTP") sector in a simultaneous flash electrically erasable programmable memory ("EEPROM").

BACKGROUND OF THE INVENTION

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

Flash memories are popular memory storage devices because they store information in the absence of continuous power and are capable of being constructed in a very compact form. Flash memory is typically constructed by fabricating a plurality of floating gate transistors in a silicon substrate. A floating gate transistor is capable of storing electrical charge either on a separate gate electrode, known as a floating gate, or in a dielectric layer underlying a control gate electrode. Generally speaking, data is stored in a non-volatile memory device by the storage of an electrical charge in the floating gate.

In order to program and/or erase a flash memory, typically a complex process must be followed. For example, before erasing a particular sector, that sector must be programmed (known as "pre-programming"). Erasing and programming sectors and cells involves complex application of high voltages to the memory cells for specified periods of time and in particular sequences. Many flash memories provide embedded state machines that perform the complex programming and erasing operations automatically. These processes of programming and erasing a flash memory may take a long time to complete. A typical erase sequence can take anywhere from 0.7 seconds up to 15 seconds. To erase an entire chip can take up to 49 seconds. While programming is much faster, on the order of seven to 300 microseconds, it is still slow compared to other memory devices. Programming an entire chip can take up to seven seconds (including the time to verify the data). Typically, standard Dynamic Random Access Memory ("DRAM") offers access times on the order of nano-seconds, a difference between microseconds of many orders of magnitude.

This complex nature of programming and erasing flash memory devices leads to a major problem in that they do not provide sufficiently fast random access. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory are orders of magnitude greater than acceptable write access times of a conventional random access main memory using DRAM. Such long latencies associated with programming or erase operations can lock up the operating system and prevent the system from functioning for unacceptably long time intervals if the flash memory is the only memory in the electronic system. Some prior flash memories allow erase-suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock-up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell that reduces the amount of storage that can be placed on the memory chip. Further, there are significant design and manufacturing complexities involved with integrating two different memory technologies on the same chip. Therefore, a device that uses an EEPROM in combination with a flash memory will typically be more expensive both to design and manufacture.

In addition, programming and erasing a flash memory involves higher than normal voltages as compared to performing read operations. The use of these higher-than-normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

A new type of flash memory has recently been developed that is capable of providing simultaneous read and write operations. In this type of flash memory, the memory device is divided into two or more banks. Each bank includes a number of sectors and each sector includes a set of memory cells. Each bank has a respective decoder circuit that selectively receives an address from an input address buffer or from an internal address sequencer controlled by an internal state machine. The output data for each bank can be communicated to a read-sense amplifier or a verify-sense amplifier. The read-sense amplifier connects to the output buffer while the verify-sense amplifier connects to the state machine. When one bank receives a write command (program or erase), the internal state machine takes control and starts the program or erase operation. While one bank is busy with the program or erase operation, the other bank can be accessed for reading data.

For a detailed discussion of sliding bank architecture, see U.S. Pat. No. 5,867,430 entitled "BANK ARCHITECTURE FOR A NON-VOLATILE MEMORY ENABLING SIMULTANEOUS READING AND WRITING" and U.S. Pat. No. 5,847,998 entitled "NON-VOLATILE MEMORY ARRAY THAT ENABLES SIMULTANEOUS READ AND WRITE OPERATIONS," which are herein incorporated by reference.

As known to those skilled in the art, flash memory may be used to store various types of information. In general, the information can be divided into two categories, code and data. Code corresponds to program code that is used to execute various operations that the flash memory is capable of performing. Data generally corresponds to fields of data that changes more frequently than code. Because code rarely, if ever, changes in lifetime of some devices, it is desirable to have the ability to write-protect sectors that store code, while leaving some sectors unprotected. Providing a write-protect function allows manufacturers to ensure that data does not mistakenly get written into a sector that is designated for code.

In some peripheral devices that use flash memory, it is necessary to ensure that a predetermined sector absolutely cannot be erased or re-programmed. As such, a one-time programmable ("OTP") sector may be incorporated into a memory device. Due to the importance of the content stored in the OTP sector, a method and system is needed to ensure the security of the data that is stored in the OTP sector. A common example of a peripheral device that uses OTP sectors is mobile communication devices, such as cellular or digital mobile telephones.

To that end, a need exists for a simultaneous operation flash memory that is capable of providing dual write protection for an OTP sector.

SUMMARY OF THE PRESENT INVENTION

The present invention discloses a simultaneous operation flash memory with dual write protection for an OTP sector. The preferred simultaneous operation flash memory includes a plurality of sectors that are divided into an upper bank and a sliding lower bank. Each bank contains at least one sector and the size of each bank may be adjusted during fabrication depending on the particular requirements set forth. The simultaneous operation flash memory is capable of write-protecting respective sectors in either the upper or sliding lower bank. Thus, irrespective of which bank a particular sector is fabricated in, the simultaneous operation flash memory is capable of write-protecting predetermined sectors, or groups of sectors, depending on the way the sectors are decoded.

In the preferred embodiment of the present invention, the simultaneous operation flash memory also locks out a predetermined sector, so that the sector cannot be erased or re-programmed by the user after being fabricated and programmed to include code data. As set forth above, some peripheral devices that use flash memory have generated a need for memory manufacturers to include at least one sector that is designated as an OTP sector. The flash memory cells in the OTP sector are programmed during fabrication and then locked out after testing so that the user cannot change the data content of the OTP sector.

The simultaneous operation flash memory includes at least one OTP sector write-protect CAM that is electrically connected with a respective lower sector select line that is used to decode the OTP sector. As known in the art, a CAM is a content addressable memory that can be used to store data. The OTP sector write-protect CAM is associated with a predetermined sector by way of its association with a respective decoder circuit. In the preferred embodiment of the present invention, if the OTP sector write-protect CAM is programmed, the OTP sector is read only. If the OTP sector write-protect CAM is in an erased state, the OTP sector is not write protected and may be erased and re-programmed.

The preferred simultaneous operation flash memory further includes at least one OTP sector lock CAM that is electrically connected with the OTP sector write-protect CAM. As previously set forth, if the simultaneous operation flash memory is manufactured with an OTP sector, there is a strong desire to be able to ensure write protection of the data stored in the OTP sector. The OTP sector lock CAM is used to ensure that the OTP sector operates as read only, by locking out the ability to erase the OTP sector write-protect CAM. To that end, the OTP sector lock CAM assures that the OTP sector write-protect CAM cannot be erased once programmed, which would indicate that the OTP sector is not write-protected. Therefore, the present invention discloses a simultaneous operation flash memory that is capable of providing dual write protection to the OTP sector.

In the preferred embodiment of the present invention, if the OTP sector write-protect CAM is in an erased state, the user can change the data stored in the OTP sector. When the simultaneous operation flash memory is being fabricated, the OTP sector is programmed and then tested to ensure that the data has been programmed into the OTP sector properly. As such, while the OTP sector is being programmed during fabrication, the OTP sector write-protect CAM is in an erased state; and, while the OTP sector is being tested, the OTP sector write-protect CAM is in a programmed state to ensure that the data programmed into the OTP sector cannot be changed during testing. After the simultaneous operation flash memory has completed in-house testing, the OTP sector lock CAM is programmed, which does not allow the OTP sector to be written to again by forcing the OTP sector write-protect CAM to remain in the programmed state at all times.

In the preferred embodiment, the status of the OTP sector write-protect CAM is dependent on the status of the OTP sector lock CAM. If the OTP sector lock CAM is programmed, the OTP sector write-protect CAM cannot be erased. As such, the user cannot change the data in the OTP sector. Thus, the present invention provides double security to the OTP sector because the OTP sector lock CAM prevents the OTP sector write-protect CAM from being erased, which in turn, prevents the OTP sector 26 being erased and re-programmed. As previously set forth, if the OTP sector write-protect CAM is in a programmed state, the OTP sector is designated to operate in a read-only state and will not be erased or programmed.

These and other features and advantages of the invention will become apparent upon consideration of the following detailed description of the presently preferred embodiments of the invention, viewed in conjunction with the appended drawings.

BRIEF DESCRIPTION OF THE DRAWINGS

FIG. 2 illustrates a table of an address scheme for decoding rows of sectors in the flash memory illustrated in FIG. 1.

FIG. 3 illustrates a table of an address scheme for decoding columns of sectors in the flash memory illustrated in FIG. 1.

DETAILED DESCRIPTION OF THE PRESENTLY PREFERRED EMBODIMENT OF THE PRESENT INVENTION

The exemplary embodiments of the invention are set forth below with reference to specific configurations, and those skilled in the art would recognize that various changes and modifications can be made on the specific configurations while remaining within the scope of the claims. The invention may be used with any type of memory device; however, the preferred embodiment of the invention is designed for a simultaneous operation flash memory. Although the preferred embodiment of the invention uses a supply voltage (Vcc) of 3.0 V, those skilled in the art would recognize that other supply voltage levels may be used. The invention may also be used with flash memory devices that use Fowler-Nordheim (F-N) or channel hot electron (CHE) injection for erase and programming.

Figure 1:
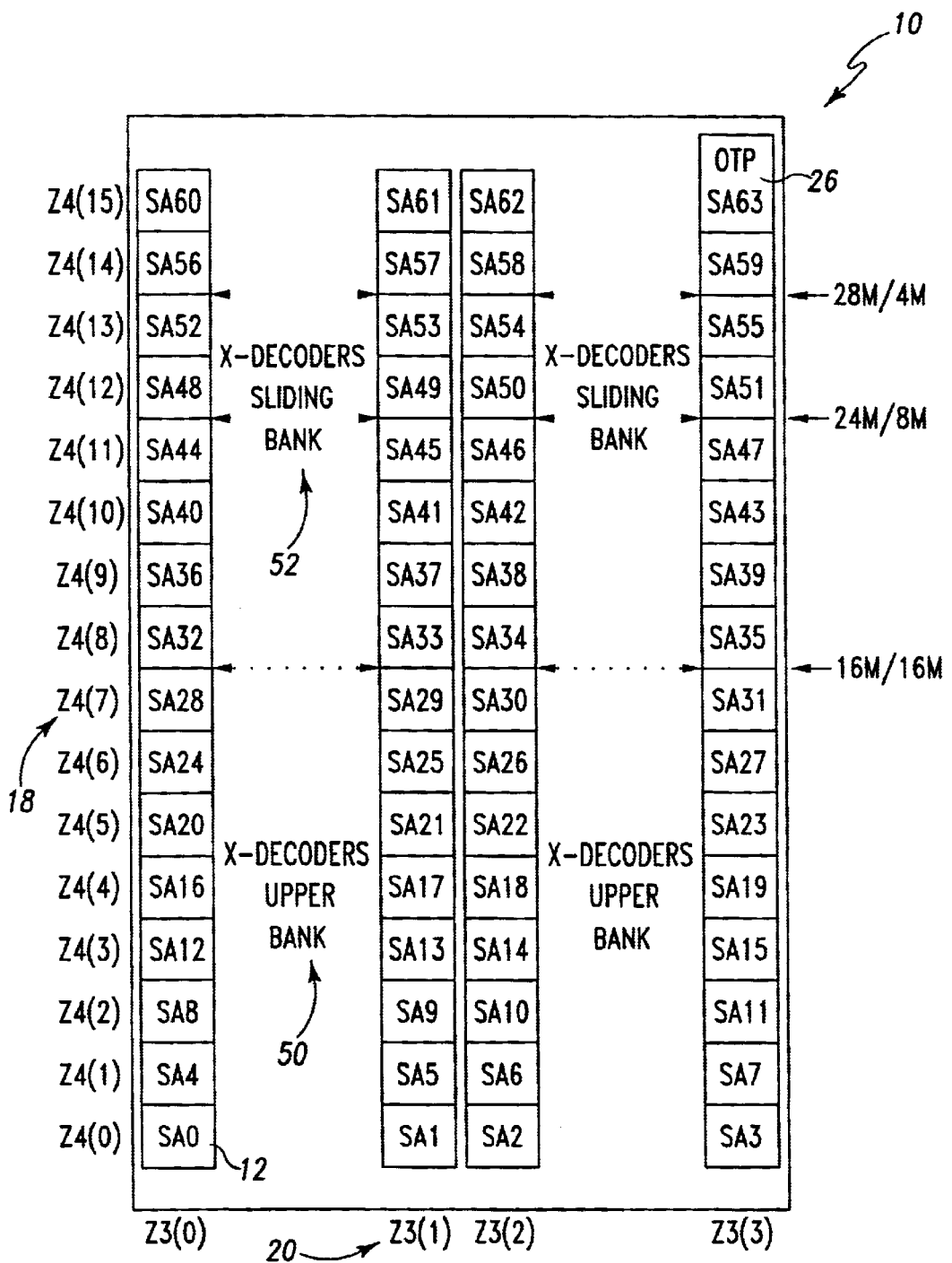
FIG. 1 illustrates a block diagram of an array of sectors in a flash memory and the sector address lines associated with each respective sector.

Referring to FIG. 1, the present invention discloses a simultaneous operation flash memory 10 that includes a plurality of storage sectors (SA0–SA63) 12, which may be selectively set up as read-only sectors. As previously set forth, for a detailed discussion of how sectors, or a group of sectors, are designated as read-only, please refer to application Ser. No. 09/421,105, entitled SECTOR WRITE PROTECT CAMS FOR A SIMULTANEOUS OPERATION FLASH MEMORY, which is assigned to the same assignee as the present invention and is herein incorporated by reference in its entirety.

In order to understand the present invention, a general background of the addressing scheme used in simultaneous operation flash memory is helpful. Although not illustrated, as known in the art, each storage sector 12 includes an array of flash transistors. In the present preferred embodiment, the simultaneous operation flash memory 10 includes sixty-four sectors (SA0–SA63) 14. Each respective sector (SA0–SA63) is preferentially arranged to store 512 kilobits of data; and, in the preferred embodiment of the invention, the sectors (SA0–SA63) combine to form a 32-megabit flash memory core. Those skilled in the art would recognize that other memory capacities exist such as 4-, 8-, 16- and 64-megabit capacities and, as cell sizes decrease, higher storage capacities are envisioned.

As illustrated in FIG. 1, in the preferred embodiment each row of sectors 12 is associated with and decoded using a respective horizontal sector address line (Z4(0)–Z4(15)) 18. In addition, each column of sectors 12 is associated with and decoded using a respective vertical sector address line (Z3(0)–Z3(3)) 20. Although not illustrated, those skilled in the art would recognize that the horizontal sector address lines (Z4(0)–Z4(15) 18 and the vertical sector address lines (Z3(0)–Z3(3)) 20 are electrically connected with respective decoder circuits in the simultaneous operation flash memory 10. As known in the art, a fundamental component of any memory device is the decoder circuits. In general, decoder circuits output a unique signal if, and only if, all of the bits of an address input correspond to a predetermined set of values. For the purpose of the present invention, it is only important to know that the decoder circuits output unique electrical signals on the horizontal sector address lines (Z4(0)–Z4(15) 18 and the vertical sector address lines (Z3(0)–Z3(4)) 20 if all of the bits of an address input to the simultaneous operation flash memory 10 correspond to a predetermined set of values.

Referring to FIG. 2, a Table is set forth that generally illustrates how a first set of address lines (A(20), A(19), A(18), A(17), A(16), A(15)) 22 is used by decoders (not shown) to decode a respective row of sectors 12 with the horizontal sector address lines (Z4(0)–Z4(15)) 18 as illustrated in FIG. 1. As known in the art, every memory device includes a plurality of address lines that are electrically connected to the memory device. Address lines are used to transfer electric signals that correspond to a predetermined sector from a peripheral device (not shown) to the simultaneous operation flash memory 10 for operations such as read, write or erase. In the preferred embodiment of the present invention, the simultaneous operation flash memory 10 includes twenty-one address line inputs in the 32-megabit design. For the purpose of the present invention, it is only necessary to understand that the address lines are used by decoder circuits (not shown) to select a respective sector 12, as set forth in detail below.

Referring to FIG. 3, a second Table is set forth that generally illustrates how a second set of address lines (A(16)–A(15)) 24 is used by the simultaneous operation flash memory 10 to decode a respective column of sectors 12 with the vertical sector address decoding lines (Z3(0)–Z3(1)) 20, as set forth in FIG. 1. The second set of address lines (A(16)–A(15) 24 is a sub-set of the first set of address lines 22 set forth above. During operation, decoder circuits (not shown) decode the electrical signals received on the first and second set of address lines 22, 24 and generate a predetermined output signal on a respective horizontal sector address line (Z4(0)–Z4(17)) 18 and a respective vertical sector address line (Z3(0)–Z3(3)) 20 that is further decoded to select a predetermined sector 12.

Referring once again to FIG. 2, in the preferred embodiment of the present invention, the simultaneous operation flash memory 10 includes an OTP sector 26. As previously set forth, the OTP sector 26 is used to store data that cannot be erased in the simultaneous operation flash memory 10. In the preferred embodiment, the OTP sector 26 is programmed and tested during fabrication, then locked in a read-only state after it is determined that the OTP sector 26 has been properly programmed.

Figure 4:
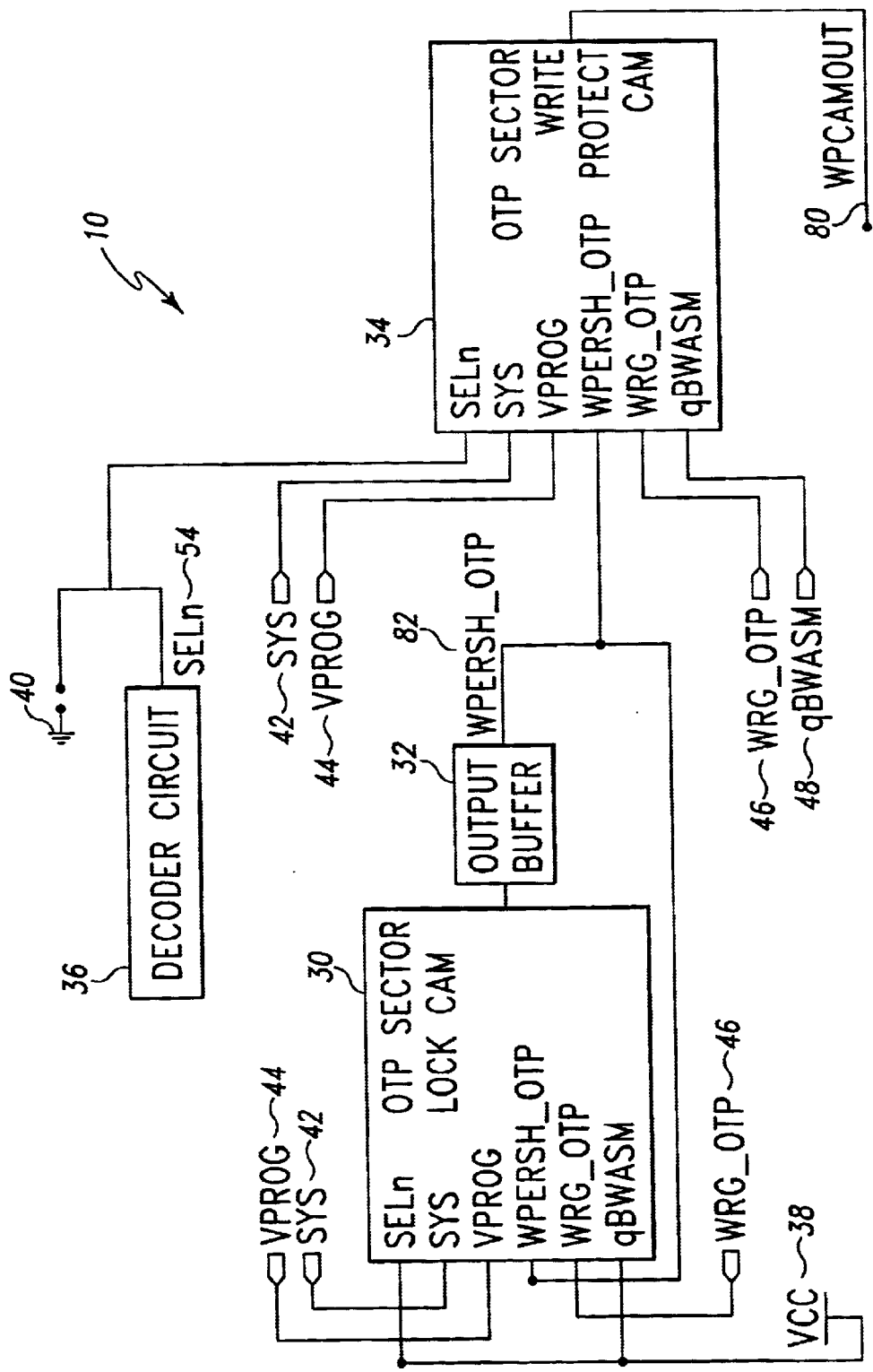
FIG. 4 sets forth a block diagram of a preferred embodiment of the present invention.

Referring to FIG. 4, a portion of the preferred simultaneous operation flash memory 10 is illustrated that incorporates a preferred embodiment of the present invention. The preferred simultaneous operation flash memory 10 includes an OTP sector lock CAM 30, an output buffer 32, an OTP sector write-protect CAM 34, a lower address ("LA") decoder circuit 36, a voltage supply connection (Vcc) 38, a ground connection 40 and a plurality of control lines 42–48 which are generally electrically connected as illustrated in FIG. 4. As illustrated, the OTP sector lock CAM 30 is electrically connected by the output buffer 32 to the OTP sector write-protect CAM 34. In the preferred embodiment of the present invention, the OTP sector write-protect CAM 34 is used to designate the OTP sector 26 as read-only and the OTP sector lock CAM 30 is used to lock the OTP sector write-protect CAM 34 in a programmed state, which indicates that the OTP sector 26 is read only.

The preferred embodiment of the present invention is designed for simultaneous operation flash memory 10 with a sliding bank architecture. Referring to FIG. 1, the design of simultaneous operation flash memory 10 that has sliding bank architecture varies depending on the way in which the chip is fabricated. Simultaneous operation flash memory 10 with sliding bank architecture is typically divided into two banks, an upper bank 50 and a sliding lower bank 52. Depending on the design chosen during fabrication, each bank 50, 52 contains a predetermined amount of storage capacity. As illustrated in FIG. 1, in the preferred embodiment of the present invention, the simultaneous operation flash memory 10 can be divided into a 16-megabit upper bank and a 16-megabit sliding lower bank, a 24-megabit upper bank and a 8-megabit sliding lower bank or a 28-megabit upper bank and a 4-megabit sliding lower bank.

As set forth above, depending on the design setup chosen during fabrication, the simultaneous operation flash memory 10 includes at least two banks 50, 52 that contain a predetermined amount of storage capacity. For the purpose of the present invention, the simultaneous operation flash memory 10 will be set forth with the OTP sector 26 located in sector SA63. The OTP sector 26 is located in the sliding lower bank 52 in the preferred embodiment. Those skilled in the art would recognize that the OTP sector 26 may be located in various sectors and that the location set forth above should not be construed as a limitation of the present invention.

Referring back to FIG. 1, in the preferred embodiment of the present invention, the OTP sector 26 is located in the sliding lower bank 52. Those skilled in the art would recognize that since the simultaneous operation flash memory 10 is set up in a sliding bank architecture, at least one LA decoder circuit 36 (see FIG. 4) and at least one upper address decoder circuit (not shown) are used to decode the respective sectors residing in each bank 50, 52. As such, since in the preferred embodiment of the present invention the OTP sector 26 is located in the sliding lower bank 52, the LA decoder circuit 36 is used to decode the OTP sector write-protect CAM 34 during operation. If the OTP sector 26 was located in the upper bank 50, the upper address decoder circuit (not shown) would be used to decode the OTP sector write-protect CAM 34.

Referring to FIG. 4, in the preferred embodiment set forth above, the LA decoder circuit 36 includes a sector select line (SELn) 54 that is electrically connected to the OTP sector write-protect CAM 34. Although not illustrated, a predetermined set of address lines 22, 24 are electrically connected with the LA decoder circuit 36 which provide electric signals to the LA decoder circuit 36 that are used to generate a predetermined output signal on the sector select line (SELn) 54 in response to predetermined input signals on the address lines 22, 24. As set forth in detail below, the sector select line (SELn) 54 is used to provide a read path from the OTP sector write-protect CAM 34 to a state machine (not shown). As known in the art, state machines are used to control the overall operation of flash memory in response to various command sets received at its inputs. For the purpose of the present invention, it is only necessary to know that the LA decoder circuit 36 begins conducting (sets to a logic "1") when the state machine receives a command set that is pointing to the OTP sector 26.

Referring once again to FIG. 4, respective control lines 42–48 are electrically connected with the OTP sector write-protect CAM 34 and the OTP sector lock CAM 30. The control lines 42–48 include CAM program line (SYS) 42, programming voltage line (VPROG) 44, CAM gate bias line (WRG_OTP) 46 and bank select line (qBWASM) 48. As set forth in detail below, each respective control line 42–48 is used to provide predetermined electric signals to the OTP sector write-protect CAM 34 and the OTP sector lock CAM 30 during operation.

Figure 5:
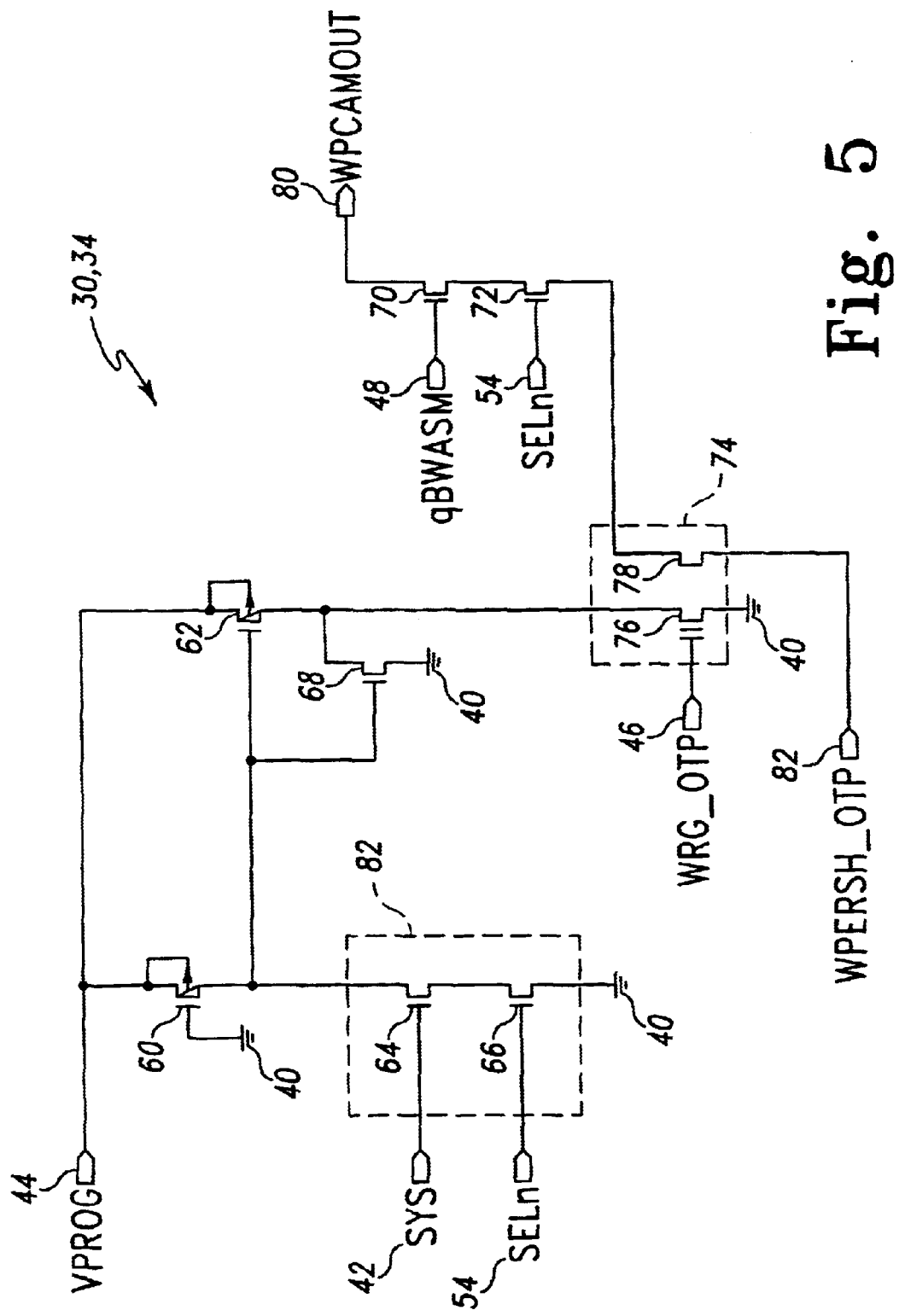
FIG. 5 is a circuit schematic of the preferred OTP sector write-protect CAM and OTP sector lock CAM.

Referring to FIG. 5, a detailed circuit schematic of the OTP sector lock CAM 30 and the OTP sector write-protect CAM 34 used in the present invention is set forth. The preferred OTP sector lock CAM 30 and the OTP sector write-protect CAM 34 each include a plurality of p-channel enhancement transistors 60, 62, a plurality of n-channel transistors 64–72 and a CAM cell 74, which are electrically connected as illustrated in FIG. 5. In particular, the source of p-channel enhancement transistor 60 and p-channel enhancement transistor 62 is electrically connected to the programming voltage line (VPROG) 44. The gate of p-channel transistor 60 is electrically connected to the ground connection 40. The drain of p-channel transistor 60 is electrically connected to the drain of n-channel transistor 64, the gate of n-channel transistor 68 and the gate of p-channel enhancement transistor 62.

The gate of n-channel transistor 64 is electrically connected to the CAM program line (SYS) 42 and the source of n-channel transistor 64 is electrically connected to the drain of n-channel transistor 66. The sector select line (SELn) 54 is electrically connected to the gate of n-channel transistor 66 and the gate of n-channel transistor 72. The source of n-channel transistor 66 is electrically connected with the ground connection 40. The drain of p-channel enhancement transistor 62 is electrically connected to the CAM cell 74 and the drain of n-channel transistor 68. The source of n-channel transistor 68 is electrically connected to the ground connection 40.

In the preferred embodiment of the present invention, the CAM cell 74 consists of a double poly device that includes a program device 76 and a read device 78. The program device 76 is a core-type flash transistor and the read device 78 is basically an intrinsic transistor, except that its poly-1 is connected to the poly-1 of the program device 76. As such, when the program device 76 is programmed, the read device 78 is also programmed since its poly-1 is charged. During operation, the sector address line (SELn) 54 and the bank select line (qBWASM) 48 use electric signals applied to the gate of n-channel transistors 70 and 72, respectively, to create a read path (WPCAMOUT) 80 on the drain of n-channel transistor 70. The read path (WPCAMOUT) 80 from the OTP sector write-protect CAM 34 is used to sense the state of the CAM cell 74 in the preferred embodiment, as set forth in detail below.

Although not illustrated in FIG. 4, the read path (WPCAMOUT) 80 of the OTP sector write-protect CAM 34 is electrically connected with a second output buffer (not shown) that is electrically connected to the state machine. During a programming/erase operation on the OTP sector 26, the OTP sector write-protect CAM 34 is decoded by predetermined electric signals applied to the sector select line (SELn) 54 and the bank select line (qBWASM) 48 thereby enabling the state machine to sense the state of the OTP sector write-protect CAM 34 through a signal received from the output buffer. If the state machine senses that the OTP sector write-protect CAM 34 is in a programmed state, the state machine will interrupt the programming/erase operation on the OTP sector 26. Likewise, if the state machine senses that the OTP sector write-protect CAM 34 is in an erased state, the state machine will not interrupt the programming operation. As such, the status of the OTP sector write-protect CAM 34 is sensed by the state machine to let it know if it is about to perform a programming operation on a write-protected sector 12 and that it should skip the programming operation if the selected sector 12 is designated as write-protected.

In the OTP sector write-protect CAM 34 and the OTP sector lock CAM 30 illustrated in FIG. 5, a ratio NAND gate 82, which is created by n-channel transistor 64 and n-channel transistor 66, pulls the gate of p-channel enhancement transistor 62 to ground during a CAM programming operation. As such, this passes a programming voltage that is applied on the programming voltage line (VPROG) 44 to the CAM cell 74, which is 5.0 V in the preferred embodiment, during the CAM programming operation. As set forth below, the CAM gate bias line (WRG_OTP) 46 is set at approximately 8.85 V during the CAM programming operation. As known in the art, these voltages are internally pumped for the OTP sector lock CAM 30 and the OTP sector write-protect CAM 34. In the preferred embodiment, n-channel transistor 68 has been added to minimize program and read disturb of the CAM cell 74 during operation.

In the preferred embodiment of the present invention, the CAM cells 74 are program margined by applying the supply voltage (Vcc) to the CAM gate bias line (WRG_OTP) 46. In addition, the CAM cells 74 are erase-margined by applying 0 V to the CAM gate bias line (WRG_OTP) 46. For erase margin, in the preferred embodiment, the CAM cells 74 must be over-erased so that they are on when the CAM gate bias line (WRG_OTP) 46 is grounded. This is the equivalent to a floating gate initialization voltage of approximately 1.1 V or a CAM cell 74 Vt=-1.15 V. The CAM cells 74 can be programmed back after erase, but may require longer program time.

As illustrated in FIG. 5, the source of the read device 78 is electrically connected with a CAM erase line (WPERSH_OTP) 82, which is the output of output buffer 32 and is controlled by the output of the OTP sector lock CAM 30. Referring to FIGS. 4 and 5, the CAM erase line (WPERSH_OTP) 82 is electrically connected to the source of the read device 78 in the OTP sector lock CAM 30 and the OTP sector write-protect CAM 34. The CAM erase line (WPERSH_OTP) 82 is used to apply a predetermined voltage to the source of the read device 78 during a CAM cell 74 erase operation. The CAM erase line (WPERSH_OTP) 82 is grounded in all other operating modes in the preferred embodiment.

When the OTP sector lock CAM 30 and the OTP sector write-protect CAM 34 are erased, approximately 5.0 V is supplied to the source of the read device 78 with the CAM erase line (WPERSH_OTP) 82, while at the same time pulsing a negative voltage on the CAM gate bias line (WRG_OTP) 46, which is -9.0 V in the preferred embodiment. This creates an erase field that electrically erases the respective CAM cell 74. The electric signals generated on the CAM erase line (WPERSH_OTP) 82 are generated with the output buffer 32 and the OTP sector lock CAM 30. The above-referenced erase of the OTP sector write-protect CAM 34 and the OTP sector lock CAM 30 is done only when the OTP sector lock CAM 30 is in erase state. If the OTP sector lock CAM 30 is programmed, the CAM erase line (WPERSH_OTP) 82 will stay at ground level, and as such both the OTP sector write-protect CAM 34 and the OTP sector lock CAM 30 cannot be erased thereby providing double protection.

As set forth in FIG. 5, the CAM gate bias voltage line (WRG_OTP) 46 is electrically connected with the gate of the program device 76 in the OTP sector lock CAM 30 and the OTP sector write-protect CAM 34. In general, the CAM gate bias voltage line (WRG_OTP) 46 supplies the gate voltage of the program device 76 during different modes. In the preferred embodiment, the CAM gate bias voltage line (WRG_OTP) 46 is set at the supply voltage (Vcc) during a read operation, around 9.0 V during CAM programming, or around -9.0 V during the CAM erase operation. Although not illustrated, the CAM gate bias voltage line (WRG) 46 is electrically connected with a CAM voltage generation circuit that generates the operational voltages set forth above during each respective operation. Those skilled in the art would recognize that various circuits exist that could generate the operational voltages set forth above depending on the respective operation.

In the preferred embodiment illustrated in FIG. 5, the gate of n-channel transistor 70 is electrically connected to the bank select line (qBWASM) 48. As previously set forth, the bank select line (qBWASM) 48 is used, in combination with a respective sector address line (SELn) 54, to create a read path (WPCAMOUT) 80 that electrically connects the OTP sector write-protect CAM 34 to the state machine through the second output buffer. In the preferred embodiment, the bank select line (qBWASM) 48 is conducting (logic "1") when the address lines 22, 24 are pointing to a sector 12 located in the sliding lower bank 52. Since the OTP sector 26 is located in the sliding lower bank 52 in the preferred embodiment, the bank select line (qBWASM) 48 is conducting when the address lines 22, 24 are pointing to a sector 12 in the sliding lower bank 52. However, if the OTP sector 26 were located in the upper bank 50, the bank select line (qBWASM) 48 would be designed to be conducting (logic "1") if the address lines were pointing to a sector 12 located in the upper bank 50. The electric signals generated on the bank select line (qBWASM) 48 are generated by a decoder circuit (not shown) in response to signals on the address lines 22, 24.

Referring once again to FIG. 4, in the preferred embodiment of the present invention, the sector select line (SELn) input and the bank select line input of the OTP sector lock CAM 30 are electrically connected to the supply voltage (Vcc) 38 for convenience only. The sector select line (SELn) input of the OTP sector lock CAM 30 corresponds to the gate of n-channel transistor 66 and n-channel transistor 72, as illustrated in FIG. 5. Those skilled in the art would recognize that the sector select line (SELn) input of the OTP sector lock CAM 30 may also be connected with the sector select line (SELn) 54, which is the output of LA decoder circuit 36, in other embodiments of the present invention. In addition, the bank select line (QBWASM) input of the OTP sector lock CAM 30 may also be connected with the second decoder circuit that decodes the bank select line (qBWASM) 48 of the OTP sector write-protect CAM 34. Referring to FIG. 5, in the preferred embodiment of the present invention, the read path (WPCAMOUT) 80 of the OTP sector lock CAM 34 is always activated since the sector select line (SELn) input and the bank select line (qBWASM) input are always conducting (logic "1") from being connected to the voltage supply (Vcc) 38.

As set forth above, the preferred embodiment of the present invention discloses a method of providing dual write protection for the OTP sector 26 in a simultaneous operation flash memory 10. In the preferred embodiment, a decoder circuit 36 is used to select a respective OTP sector write-protect CAM 34 if the decoder circuit receives a predetermined set of inputs from a plurality of address lines 22, 24. As recognized by those skilled in the art, the OTP sector write-protect CAM 34 will only be selected if the electric signals on the address lines 22, 24 are pointing to the OTP sector 26 in the simultaneous operation flash memory 10. Once the OTP sector write-protect CAM 34 has been selected, a read path (WPCAMOUT) 80 is created between the OTP sector write-protect CAM 34 and the state machine, which is then able to sense the state of the OTP sector write-protect CAM 34.

In the preferred embodiment of the present invention, if the OTP sector write-protect CAM 34 is programmed, the OTP sector 26 is write-protected. If the OTP sector write-protect CAM 34 is not programmed, the OTP sector 26 is not write-protected. During fabrication, the OTP sector write-protect CAM 34 is not programmed until the OTP sector 26 has been programmed. Once the OTP sector 26 is programmed, the OTP sector write-protect CAM 34 is programmed so that the data content stored in the OTP sector 26 cannot be changed.

Once the data content that has been programmed and stored in the OTP sector 26 has been verified during testing, the OTP sector lock CAM 30 is programmed to further ensure that the data stored in the OTP sector 26 cannot be changed. In the preferred embodiment, the OTP sector lock CAM 30 locks the OTP sector write-protect CAM 34 in the programmed state so that it cannot be erased. As set forth above, when the OTP sector write-protect CAM 34 is in the programmed state, the OTP sector 26 can only be used as a read-only sector. To that end, the present invention provides a simultaneous operation flash memory 10 that is capable of providing dual protection for the OTP sector 26.

Referring once again to FIG. 4, in the preferred embodiment of the present invention, the sector select line (SELn) 54 of the LA decoder circuit 36 may be fabricated to be electrically connected to the ground connection 40 in alternative embodiments of the present invention. In this design setup, the simultaneous operation flash memory 10 is said to be in the uniform setup. To that end, the OTP sector write-protect CAM 34 is never enabled and the sector 12 referred to herein as the OTP sector 26 becomes a normal sector 12 in the simultaneous operation flash memory 10.

It is to be noted that suitable transistor sizes specifying channel width to length ratios (measured in micrometers or microns) for the transistors that make up the circuits used in the present invention have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

Although the detailed description describes embodiments using a flash EPROM with a sliding back architecture, the invention may be used with any nonvolatile writeable memory, including, but not limited to, EPROMs, EEPROMs, and flash memories, including technologies such as NOR, NAND, AND, Divided bit-line NOR (DINOR), and Ferro-electric Random Access Memory ("FRAM"). While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A simultaneous operation flash memory capable of providing double protection to an OTP sector, comprising:
   an OTP sector write-protect CAM, wherein said OTP sector write-protect CAM is capable of designating said OTP sector as write-protected; and
   an OTP sector lock CAM electrically connected with said OTP sector write-protect CAM, wherein said OTP sector lock CAM locks said OTP write-protect CAM in a programmed state.

2. The simultaneous operation flash memory (10) of claim 1, further comprising a decoder circuit (36) electrically connected to said OTP sector write-protect CAM (34).

3. The simultaneous operation flash memory (10) of claim 2, wherein said decoder circuit (36) generates a predetermined output signal if an address input equals a predetermined set of values that decode said OTP sector (26).

4. The simultaneous operation flash memory (10) of claim 1, wherein said OTP sector write-protect CAM (34) is in a programmed state if said OTP sector (26) is designated as write-protected.

5. The simultaneous operation flash memory (10) of claim 1, wherein said OTP sector write-protect CAM (34) is in an erased state if said OTP sector (26) is designated as not write-protected.

6. The simultaneous operation flash memory (10) of claim 1, further including an output buffer (32) electrically connected with said OTP sector lock CAM (30) and said OTP sector write-protect CAM (34).

7. The simultaneous operation flash memory (10) of claim 6, wherein said output buffer (32) directs a predetermined electric signal to said OTP sector write-protect CAM (34) that locks said OTP sector write-protect CAM (34) in a programmed state.

8. The simultaneous operation flash memory (10) of claim 1, wherein said OTP sector lock CAM (30) and said OTP sector write-protect CAM (34) include a CAM cell (74).

9. The simultaneous operation flash memory (10) of claim 8, wherein said CAM cell (74) includes a program device (76) that comprises a flash transistor.

10. The simultaneous operation flash memory (10) of claim 8, wherein said CAM cell (74) includes a read device (78) that comprises an intrinsic transistor.

11. The simultaneous operation flash memory (10) of claim 1, further comprising a state machine electrically connected with a read path (80) of said OTP sector write-protect CAM (34), wherein said state machine is used to sense the state of said OTP sector write-protect CAM (34) and interrupt a programming operation designated for said OTP sector (26) if said OTP sector write-protect CAM (34) is in a programmed state.

12. A simultaneous operation flash memory (10) with dual protection for an OTP sector (26), comprising:
   at least one decoder circuit (36) for decoding a plurality of input signals from a plurality of address lines (22), wherein said decoder circuit (36) generates a respective output signal when said plurality of input signals equals a predetermined set of values;
   an OTP sector write-protect CAM (34) electrically connected with said respective output of said decoder circuit (36), wherein the state of said OTP sector write-protect CAM (34) is used to designate said OTP sector (26) as write-protected; and
   an OTP sector lock CAM (30) electrically connected with said OTP sector write-protect CAM (34), wherein said OTP sector lock CAM (30) is capable of locking said OTP sector write-protect CAM (34) designating said OTP sector (26) as write-protected.

13. The simultaneous operation flash memory (10) of claim 12, wherein said OTP sector write-protect CAM (34) is in a programmed state if said OTP sector (26) is designated as write-protected.

14. The simultaneous operation flash memory (10) of claim 12, wherein said OTP sector write-protect CAM (34) is in an erased state if said OTP sector (26) is designated as not write-protected.

15. The simultaneous operation flash memory (10) of claim 12, further including an output buffer (32) electrically connected with said OTP sector lock CAM (30) and said OTP sector write-protect CAM (34).

16. The simultaneous operation flash memory (10) of claim 15, wherein said output buffer (32) directs a predetermined electric signal to said OTP sector write-protect CAM (34) that locks said OTP sector write-protect CAM (34) in a programmed state.

17. The simultaneous operation flash memory (10) of claim 12, wherein said OTP sector lock CAM (30) and said OTP sector write-protect CAM (34) includes a CAM cell (74).

18. The simultaneous operation flash memory (10) of claim 17, wherein said CAM cell (74) includes a program device (76) that comprises a flash transistor.

19. The simultaneous operation flash memory (10) of claim 17, wherein said CAM cell (74) includes a read device (78) that comprises an intrinsic transistor.

20. The simultaneous operation flash memory (10) of claim 12, further comprising a state machine electrically connected with a read path (80) of said OTP sector write-protect CAM (34), wherein said state machine is used to sense the state of said OTP sector write-protect CAM (34) and interrupt a programming operation designated for said OTP sector (26) if said OTP sector write-protect CAM (34) is in a programmed state.

21. A method of providing dual protection for an OTP sector (26) in a simultaneous operation flash memory (10), comprising the steps of:

programming a predetermined amount of data in said OTP sector (26);

write-protecting said OTP sector (26) with an OTP sector write-protect CAM (34); and locking said OTP sector write-protect CAM (34) in a write-protect state with a OTP sector lock CAM (30).

22. The method of claim 21, wherein said OTP sector (26) is write-protected when said OTP sector write-protect CAM (34) is in a programmed state.

23. The method of claim 21, wherein said OTP sector (26) is not write-protected when said OTP sector write-protect CAM (34) is not in a programmed state.

24. The method of claim 21, further comprising the step of enabling a read path (80) from said OTP sector write-protect CAM (34) to a state machine.

25. The method of claim 22, further comprising the step of interrupting a programming operation with said state machine if said OTP sector (26) is selected for programming.

* * * * *